US008822978B2

(12) United States Patent
Cowell, III et al.

(10) Patent No.: US 8,822,978 B2
(45) Date of Patent: *Sep. 2, 2014

(54) AMORPHOUS MULTI-COMPONENT METALLIC THIN FILMS FOR ELECTRONIC DEVICES

(71) Applicant: The State of Oregon Acting by and Through the State Board of Higher Education on behalf of Oregon State University, Corvallis, OR (US)

(72) Inventors: E. William Cowell, III, Corvallis, OR (US); John F. Wager, Corvallis, OR (US); Brady J. Gibbons, Corvallis, OR (US); Douglas A. Keszler, Corvallis, OR (US)

(73) Assignee: The State of Oregon Acting by and through..., Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/868,308

(22) Filed: Apr. 23, 2013

(65) Prior Publication Data

US 2014/0191197 A1      Jul. 10, 2014

Related U.S. Application Data

(63) Continuation of application No. 12/777,194, filed on May 10, 2010, now Pat. No. 8,436,337.

(60) Provisional application No. 61/216,073, filed on May 12, 2009.

(51) Int. Cl.
    H01L 29/72   (2006.01)
    H01L 29/861  (2006.01)
    H01L 29/73   (2006.01)
    H01L 29/66   (2006.01)
    H01L 29/732  (2006.01)

(52) U.S. Cl.
    CPC ...... *H01L 29/7311* (2013.01); *H01L 29/66265* (2013.01); *H01L 29/7317* (2013.01); *H01L 29/732* (2013.01); *H01L 29/66272* (2013.01)
    USPC ... 257/29; 257/506; 257/E29.327; 257/E29.173; 257/E21.002

(58) Field of Classification Search
    USPC ........ 25/29, 506, E21.002, E29.173, E29.327
    See application file for complete search history.

(56) References Cited

U.S. PATENT DOCUMENTS 4,983,025 A    1/1991    Umemura
5,577,021 A    11/1996   Nakatani (Continued)

FOREIGN PATENT DOCUMENTS

JP    01220473     9/1989
JP    07122406     5/1995
JP    2006032951   2/2006

OTHER PUBLICATIONS

International Search Report dated Jan. 24, 2012 (Application No. PCT/US2011/035861).

(Continued)

*Primary Examiner* — Mamadou Diallo
(74) *Attorney, Agent, or Firm* — Niels Haun

(57) ABSTRACT

An electronic structure comprising: (a) a first metal layer; (b) a second metal layer; (c) and at least one insulator layer located between the first metal layer and the second metal layer, wherein at least one of the metal layers comprises an amorphous multi-component metallic film. In certain embodiments, the construct is a metal-insulator-metal (MIM) diode.

25 Claims, 11 Drawing Sheets

(56) References Cited

U.S. PATENT DOCUMENTS

| | | | |
|---|---|---|---|
| 5,742,471 | A | 4/1998 | Barbee, Jr. et al. |
| 5,744,817 | A | 4/1998 | Shannon |
| 6,208,234 | B1 | 3/2001 | Hunt |
| 6,376,349 | B1 | 4/2002 | Tobin et al. |
| 6,660,660 | B2 | 12/2003 | Haukka et al. |
| 6,853,185 | B2 | 2/2005 | Tsukamoto et al. |
| 6,902,763 | B1 | 6/2005 | Elers et al. |
| 7,105,852 | B2 | 9/2006 | Moddel et al. |
| 7,595,500 | B2 | 9/2009 | Moddel et al. |
| 2005/0077519 | A1 | 4/2005 | Ahn |
| 2006/0071340 | A1 | 4/2006 | Zhong |
| 2006/0177975 | A1 | 8/2006 | Ahn |
| 2007/0229212 | A1 | 10/2007 | Ballantine |
| 2007/0274121 | A1 | 11/2007 | Lung |
| 2008/0038293 | A1 | 2/2008 | Vaughn |
| 2008/0121962 | A1 | 5/2008 | Forbes |
| 2010/0214719 | A1 | 8/2010 | Kim |
| 2010/0289005 | A1 | 11/2010 | Cowell |
| 2010/0301452 | A1 | 12/2010 | Wang |

OTHER PUBLICATIONS

Written Opinion dated Jan. 24, 2012 (Application No. PCT/US2011/035861).

International Preliminary Report of Patentability dated Nov. 22, 2012 corresponding to PCT/US2011/035861.

Berger, "Metallic Glass Promises to Become a Useful Material for Nanotechnology Fabrication," posted online Jan. 26, 2007, available at http://www.nanowerk.com/spotlight/spotid=1336.php.

Matsumoto, et al., In Situ Analysis of the Thermal Behavior in the Zr-Based Multi-Component Metallic Thin Film by Pulsed Laser Deposition Combined with UHV-Laser Microscope System, Materials Science and Engineering B 148:179-182, 2008.

Sharma, et al., "Nanoscale Patterning of Zr-Al-Cu-Ni Metallic Glass Thin Films Deposited by Magnetron Sputtering," Journal of Nanosciences and Nanotechnology 5:416-420, 2005.

Written Opinion dated Feb. 7, 2014 (Application No. PCT/US2013/067443).

International Search Report dated Feb. 7, 2014 (Application No. PCT/US2013/067443).

International Preliminary Report on Patentability dated Nov. 22, 2012 corresponding to PCT/US2011/035861.

International Search Report dated Jan. 24, 2012 (Application No. PCT/US2011/035861).

International Search Report dated Jun. 13, 2012 (Application No. PCT/US2012/029684).

Matsumoto et al., "In situ analysis of the thermal behavior in the Zr-based multi-component metallic thin film by pulsed laser deposition combined with UHV-laser microscope system," Materials Science and Engineering B 148:179-182, 2008.

Sharma et al., "Nanoscale Patterning of Zr—Al—Cu—Ni Metallic Glass Thin Films Deposited by Magnetron Sputtering," Journal of Nanoscience and Nanotechnology 5:416-420, 2005.

Written Opinion dated Jan. 24, 2012 (Application No. PCT/US2011/35861).

Written Opinion dated Jun. 13, 2012 (Application No. PCT/US2012/029684).

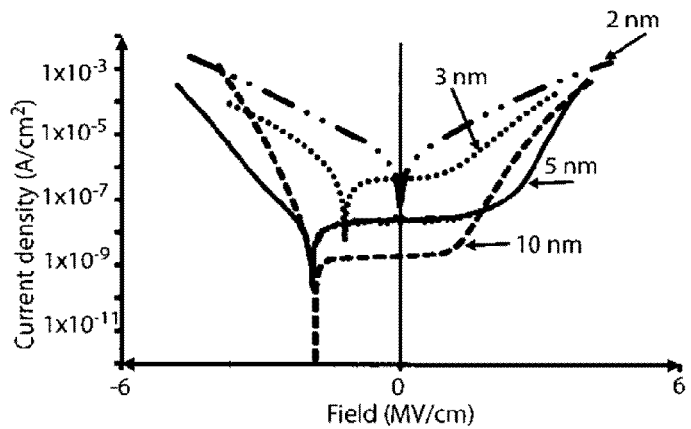
FIG. 10a
| Dielectric Thickness (nm) | Asymmetry Field (MV/cm) | Asymmetry |
|---|---|---|
| 2 | 4.00 | 0.85 |
| 3 | 4.00 | 3.58 |
| 5 | 3.30 | 27.70 |
| 10 | 4.00 | 1.65 |
FIG. 10b
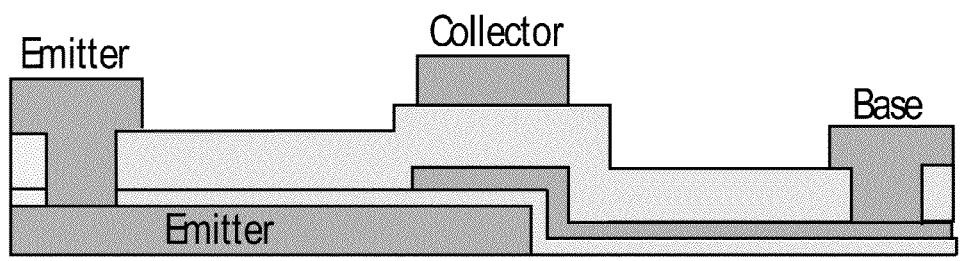
FIG. 11

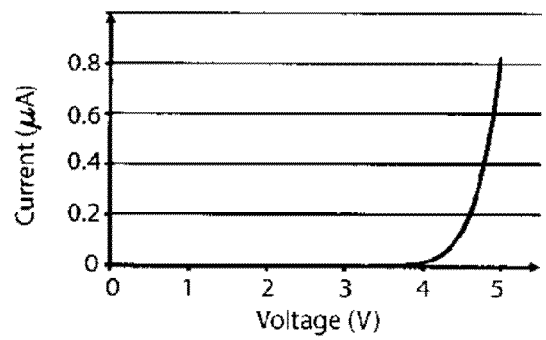
FIG. 12a  FIG. 12b
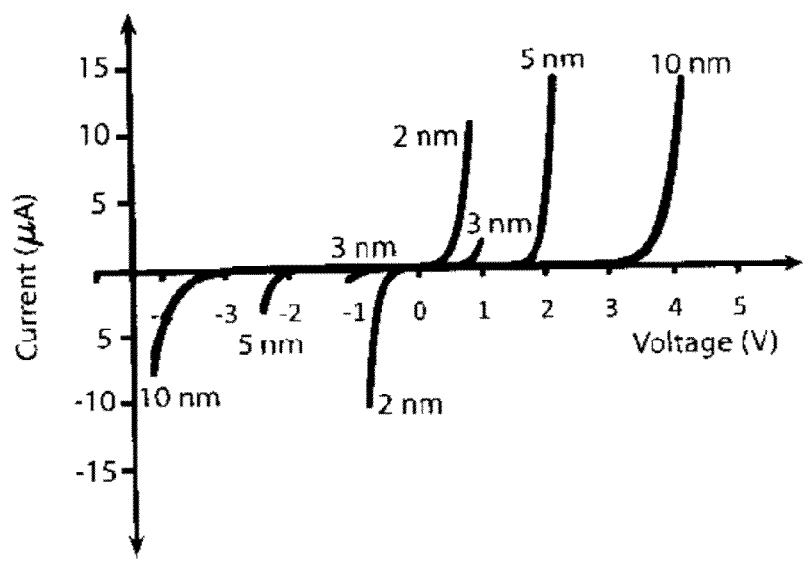
FIG. 13
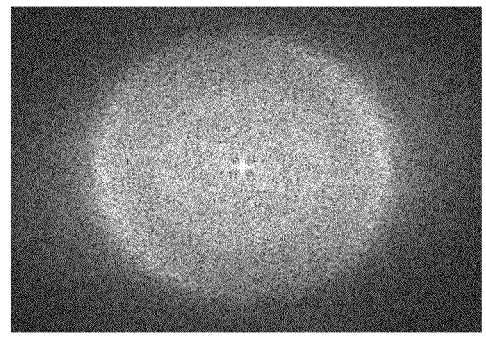
FIG. 14

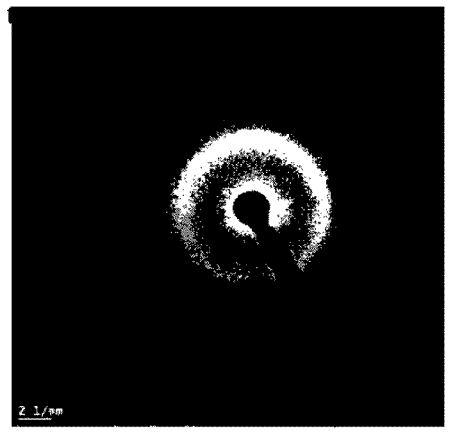 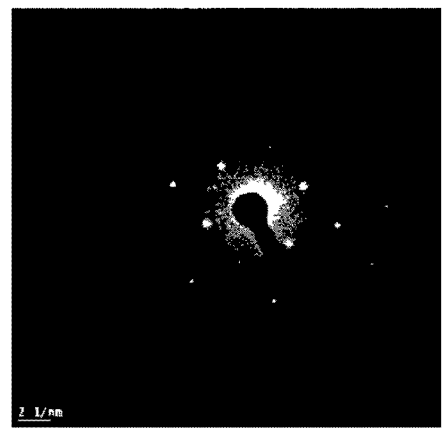
FIG. 19a	FIG. 19b
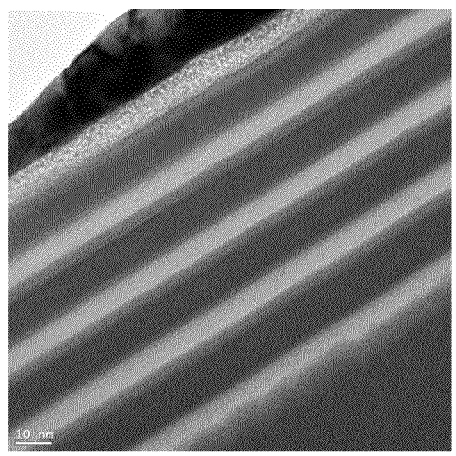
FIG. 20

AMORPHOUS MULTI-COMPONENT METALLIC THIN FILMS FOR ELECTRONIC DEVICES

CROSS REFERENCE TO RELATED APPLICATIONS

This application is a continuation of U.S. patent application Ser. No. 12/777,194, filed May 10, 2010, which claims the benefit of U.S. Provisional Application No. 61/216,073, filed May 12, 2009, which are incorporated herein by reference.

ACKNOWLEDGMENT OF GOVERNMENT SUPPORT

This invention was made in part with government support under W909MY-06-C-0038 and W911NF-07-2-0083 awarded by the U.S. Army Research Laboratory. The government has certain rights in the invention.

BACKGROUND

Diodes may be utilized in integrated circuitry for numerous applications. For instance, diodes may be utilized for regulating current flow, and/or may be utilized as select devices for selectively accessing components of the integrated circuitry.

A class of diodes that is of particular interest are so called metal-insulator-metal (MIM) diodes, which are diodes having one or more electrically insulative materials sandwiched between a pair of electrically conductive electrodes. The electrodes may be defined to be a first electrode and a second electrode. The diodes may be considered to control electron flow from the first electrode to the second electrode, and to impede electron flow from the second electrode to the first electrode. Since current flow is defined to be in the opposite direction to electron flow; the diodes may also be considered to control current flow from the second electrode to the first electrode, and from the first electrode to the second electrode.

SUMMARY

Disclosed herein is an electronic device structure comprising:
(a) a first metal layer;
(b) a second metal layer;
(c) and at least one insulator layer located between the first metal layer and the second metal layer, wherein at least one of the metal layers comprises an amorphous multi-component metallic film.

Also disclosed herein is an electronic device structure comprising:
(a) at least one electrode comprising an amorphous multi-component metallic film; and
(b) at least one other substrate positioned adjacent to amorphous multi-component film.

Processes for making electronic device structures are also disclosed herein.

One such process is a method for making an electronic device structure comprising:
forming an amorphous multi-component metallic film electrode on a first substrate; and
depositing at least one layer on the multi-component metallic film electrode.

Another process is a method for making a metal-insulator-metal diode comprising:
forming a first electrode on a first substrate wherein the first electrode defines a first surface facing the first substrate and an opposing second surface;
forming an insulator layer on the second surface of the first electrode, wherein the insulator layer defines a first surface facing the first electrode and an opposing second surface; and forming a second electrode on the second surface of the insulator layer, wherein at least one of the electrodes comprises an amorphous multi-component metallic film.

The foregoing is disclosed in the following detailed description, which proceeds with reference to the accompanying figures.

BRIEF DESCRIPTION OF THE DRAWINGS

FIG. 10: (a) Logarithmic current versus applied field for MIM diodes with differing dielectric thicknesses. The thickness of the $Al_2O_3$ dielectrics is listed next to the diode's I-V curve. The diodes all have blanket ZrCuAlNi lower electrodes and 1 mm² shadow masked ZrCuAlNi upper electrodes. (b) Asymmetry metric for each MIM diode calculated at the asymmetry field indicated.

FIG. 11: Cross sectional illustration of a HET structure fabricated with ZrCuAlNi AMMF electrodes.

FIG. 12: (a) Illustration of layer material and thicknesses used in the first MIM with an AMMF electrode. (b) I-V curve of the MIM represented in (a).

FIG. 13: Overlaid I-V curves of MIM diodes with differing tunnel dielectric thicknesses. The thickness of the $Al_2O_3$ dielectric is listed next to the diode's I-V curve. The diodes all have blanket ZrCuAlNi AMMF lower electrodes and 1 mm2 shadow masked ZrCuAlNi AMMF upper electrodes.

FIG. 14: Electron diffraction image from 10 nm $TiAl_3$ film that was heated to 300° C. during solution based AlPO dielectric depositions for 1 min per AlPO layer (TEM of stack used for diffraction is next image).

FIG. 19: (a) An electron diffraction pattern from a 200 nm ZrCuAlNi AMMF deposited onto a 1 inch by 1 inch Si=$SiO_2$ substrate. (b) An electron diffraction pattern from the Si substrate.

FIG. 20: TEM micrograph of a ZrCuAlNi AMMF/aluminum phosphate glass nanolaminate.

DETAILED DESCRIPTION

Amorphous, multi-component metallic films (AMMFs) are herein disclosed for application, for example, in vertical transport thin-film transistors (VTTFTs), and metal:insulator:metal (MIM) tunnel diodes. Specifically, multi-component combinations of metals of differing atomic radii are selected as appropriate constituents for the realization of high-performance conductors in TFT applications and MIM tunneling diodes. These AMMFs may be compositionally homogeneous or inhomogeneous.

The AMMFs can be utilized as electrodes in two terminal and three terminal electronic devices. In particular, the AMMFs can be utilized as electrodes for metal:insulator:metal tunneling diodes. Additionally, AMMFs can be utilized as electrodes in metal:semiconductor:metal diodes and metal:insulator:metal:insulator:metal hot electron transistor electronic devices.

Metal Insulator Metal Tunnel Diodes

The MIM tunnel diode involves the incorporation of AMMFs into MIM structures as the metal electrodes. The homogeneously smooth surface of AMMFs offer an advantage over crystalline metals in that there fewer surface imperfections that can cause inhomogeneity in the electric field of the device. Areas of high electric field would cause stress on the insulator resulting in poor diode performance and failure. The measured diode curves exhibit very high pre-turn on resistance and consistent/repeatable exponential increase of tunneling current with increasing voltage. These characteristics support the existence of a high quality interface between the AMMF electrode and the tunneling oxide.

Figure 2:
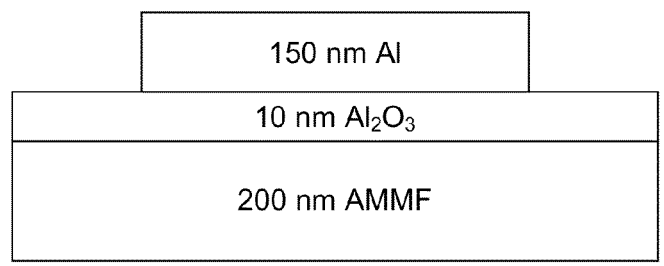
FIG. 2: Physical structure of a MIM tunnel diode as disclosed herein.

Additionally, the multi-component nature of AMMFs inherently allows for flexibility of stoichiometry. This stoichiometric flexibility in turn allows for the engineering of the work function of AMMFs. Asymmetric electrode work functions allows for the engineering of asymmetric tunneling turn-on voltages and current characteristics in positive and negative operating voltages. This is exhibited in the supplied current-voltage (IV) curves. Examples of fabricated devices disclosed herein (see FIG. 2) have an AMMF ($Zr_{55}Cu_{30}Al_{10}Ni_5$) as the grounded lower electrode, a 10 nm $Al_2O_3$ tunneling insulator deposited via atomic layer deposition (ALD), and an Al upper electrode through which the voltage is applied.

In certain embodiments, the MIM diodes exhibit negligible current flow between the electrodes in the off-state, but once the applied voltage reaches the Fowler-Nordheim tunneling effect threshold the current increases exponentially.

Vertical Transport Thin-Film Transistors

Figure 1:
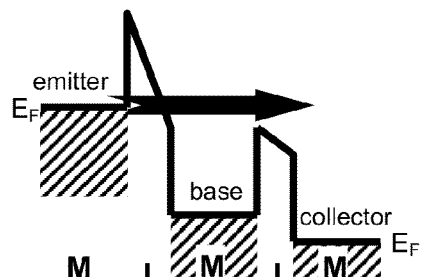
FIG. 1: Energy band diagram of a MIMIM HOT.

The thin-film transistor (TFT) applications involve the incorporation of thin and ultra-thin AMMFs into vertical transport TFTs (VTTFTs). As evident from its name, VTTFTs employ vertical carrier transport, rather than conventional lateral carrier transport, with the intention of dramatically improving the TFT high frequency performance, since vertical dimensions can more conveniently and economically be controlled during TFT fabrication than lateral dimensions. There are two primary VTTFT types: hot electron transistors (HETs) and permeable base transistors (PBTs). Both HETs and PBTs possess three metal contact layers, usually denoted as the emitter, base, and collector. Energy band diagram representations of a representative MIMIM HET is shown in FIG. 1.

AMMFs offer several advantages for use as emitter and base contacts. For example, AMMFs may be used as the first-deposited, bottom layer in a HET or PBT, which, in conjunction with its insulator or semiconductor overlayer, will function as the emitter which injects carriers (i.e., electrons or holes) into the base. A unique property of certain embodiments of an AMMF thin film is its amorphous nature which enables it to possess homogeneously smooth surface. This physical property allows subsequent insulator, semiconductor, and/or metal layers to be deposited onto the surface of this contact layer to realize a uniform electric potential barrier between layers. The availability of a homogeneously smooth interface between the AMMF emitter contact and the overlying insulator or dielectric will facilitate uniform emitter carrier injection.

An AMMF could also be used as a base contact in an MIMIM HET structure. Surface smoothness and a homogeneous, contiguous layer are factors that AMMFs appears to be uniquely suited to meet. Additionally, in a HET this base layer must be thin enough (~10-50 nm) so that a significant fraction of the carriers injected from the emitter into the base can transit ballistically or near-ballistically through the base. If the base thickness is not precisely controlled, the performance of the HET will be compromised, as discussed in the following.

An amorphous metal solid is a rigid material whose structure lacks crystalline periodicity; that is, the pattern of constituent atoms or molecules does not repeat periodically in three dimensions. The amorphous metals are multi-component, that is, they comprise at least two or more metal components, in order to frustrate crystallization. Hence, amorphous metals are identified herein with the descriptor amorphous multi-component metallic films (AMMFs).

AMMFs are substantially amorphous such that crystalline aspects of the film are suppressed. The suppression of crystalline aspects creates a uniform potential barrier at the interface formed between an AMMF and a dielectric. In one aspect, whether or not a material is amorphous can be measured by testing the resistivity of the material. For example, an amorphous material exhibits resistivity at least an order of magnitude greater than the crystalline metals. In another embodiment, a material is an AMMF if the resistivity is at least 100 μΩ-cm, more particularly at least 150 μΩ-cm, and especially 100-250 μΩ-cm.

In certain examples, the AMMFs may have a homogeneously smooth surface. For instance, the root mean square (RMS) roughness of the AMMF surface may be less than 3 nm, more particularly less than 0.5 nm. In other embodiments, the AMMF surface is characterized by a surface that lacks sharp morphologies characteristic of crystalline metals. The AMMF surface can acts as a potential barrier to nucleation that remains stable below 500° C.

In one embodiment, the AMMF films are thin (less than 200 nm) or ultra thin (less than 20 nm), smooth (less than 2 nm RMS roughness), conducting (less than 500 μΩ-cm), and/or mechanically robust.

The AMMF can be made from at least one element selected from Groups II-XV. According to particular embodiments, the element(s) is selected from Groups IV, V, VI, X, Al, Mg, Sn or Zn. Illustrative AMMFs include ZrCuAlNi and $TiAl_3$. In certain embodiments, the multi-component combinations of the metallic elements with varying atomic radii are selected to result in a deep eutectic point for emitter and base conductors in the realization of high-performance VTTFTs or MIM diodes.

The AMMFs may be formed by any film-forming technique such as sputtering, solution deposition, or electron-beamed deposition. For example, multi-source RF (or DC) magnetron sputtering using elemental or mixed composition metal targets of Zr, Cu, Ni, and Al may be employed to make the AMMFs. Sputter deposition affords AMMFs a distinct manufacturing advantage over similarly smooth semiconductors deposited using advanced epitaxial technologies such as molecular beam epitaxy (MBE) or metal-organic chemical vapor deposition (MOCVD). In certain embodiments, the MIM diodes can be made with simple, low cost fabrication techniques (for example, sputtering for the AMMF lower electrode, ALD for the insulator layer, and shadow masking for the upper electrode). In certain embodiments, the AMMFs are not etched. The ability to deposit thin/smooth AMMFs at room temperature via sputtering that stay amorphous (and smooth) with heated processing lends itself to applications in VTT and MIM tunnel diode applications.

The AMMF may be deposited on any type of substrate (e.g. silicon, glass, or a polymeric material such as thermoplastic or thermoset).

The dielectric layer for use in association with the AMMF may be made from any type of dielectric material. Illustrative materials include $Al_2O_3$, aluminum phosphate, silicon dioxide, a metal halide (e.g., calcium fluoride), zirconium oxide, hafnium dioxide, titanium dioxide, $SnO_2$, ZnO and combinations thereof.

The dielectric layer may be made by any layer-forming process such as, for example, sputtering, atomic layer deposition (ALD), solution processing, chemical vapor deposition (CVD) or plasma enhanced chemical vapor deposition (PECVD). In the case of ALD, it is possible to form an insulator layer with 12 to 500 pulses, more particularly 12 to 225 pulses. In certain embodiments, the insulator layer may be made with as few as 5 pulses. The electronic structure (e.g., MIM diode) may include more than one insulator layers between conductive layers (e.g, the lower and upper electrodes of a MIM diode).

As described above, other conductive layers (e.g, an electrode) may be included in the structures that also include at least one AMMF. Such conductive layers may be made from any conductive material such as for example, a metal (Ru, Ir, Pt, Al, Au, Ag, Nb, Mo, W, Ti), or a metal nitride (TiN, TaN, WN, NbN). Such conductive layers may also be made by any layer-forming process such as, for example, sputtering, atomic layer deposition, solution processing or electron-beam deposition.

EXAMPLES

The material and electrical characterization of AMMFs and the electrical characterization of electronic devices fabricated with AMMF electrodes are described below in the examples.

The following data illustrates:
1) The fact that AMMFs with homogeneously smooth surfaces can be deposited via sputtering
2) The fact that such films maintain their surface homogeneity after certain types of post-deposition thermal processing.
3) The substantially amorphous nature of such films.

Materials Analysis

Materials analysis was performed to provide an understanding of the growth rates, composition, atomic order, surface morphology, and work function characteristics of ZrCuAlNi AMMFs. An understanding of an AMMF's material characteristics was leveraged in the creation of a process through which electronic devices with ZrCuAlNi AMMF electrodes are fabricated. All AMMFs analyzed were deposited onto 1 inch by 1 inch substrates consisting of Si with 100 nm of thermally grown $SiO_2$ unless noted otherwise.

ZrCuAlNi AMMF Growth Characterization

Sputter deposition parameters were varied to investigate the impact of pressure, power, and voltage on the deposition rate of AMMFs. The ZrCuAlNi AMMFs used to investigate AMMF deposition parameters were grown using a three inch vacuum arc melted metallic target manufactured by Kamis, Inc. To create a step in the deposited ZrCuAlNi AMMF, Kapton tape is applied to the edge of the substrate prior to the sputter deposition. After the deposition, the tape is removed and the step is measured with a KLA/Tencor Alpha Step 500 profilometer. The Alpha Step 500 used to measure the film thickness has good precision down to 60 nm. At film thicknesses below 60 nm, the Alpha Step 500 does not give repeatable measurements, hence AMMF depositions for growth rate characterizations are targeted at thicknesses greater than 60 nm but are not limited to thicknesses greater than 60 nm.

Deposition times between 10 minutes and 25 minutes yield growth rates that average 23 nm/min with a standard deviation of 2 nm/min. The ZrCuAlNi target used to grow the AMMFs is conducting, therefore RF magnetron sputtering is not needed. DC magnetron sputtering offers faster deposition rates, which allows for the use of lower applied power. A low applied deposition power also may be useful in creating a pristine interface between the deposited AMMF and the substrate that the AMMF is being deposited onto. A survey of DC magnetron powers shows a consistent growth rate near 10 nm/min is achieved by the application of 60 W at a pressure of 3 mtorr. A 10 nm/min deposition rate allows for quick calculations of the deposition time required for targeted AMMF thickness. Therefore, a power of 60 W at a pressure of 3 mtorr is employed as the standard condition for ZrCuAlNi AMMF depositions. 60W of DC power at a pressure of 3 mtorr using a 20 sccm flow of Ar is referred to as the standard deposition conditions.

Investigations into AMMF Composition

The composition of ZrCuAlNi AMMFs deposited at three sputtering conditions was analyzed via electron probe microanalysis (EPMA) to determine if composition changed with differing sputter conditions. Table lists the investigated sputter deposition conditions and the associated weight and atomic percentages of the constituent elements in the AMMF. It is seen that over a wide range of deposition conditions, the composition of the ZrCuAlNi AMMF does not significantly change from a composition near $Zr_{40}Cu_{35}Al_{15}Ni_{10}$. The ZrCuAlNi AMMF was deposited with the standard deposition conditions. During the XPS analysis, the substrate is positioned at a grazing angle relative to the x-ray source to improve the depth resolution of the profile. An Ar ion beam is used to sputter the AMMF film in order to obtain a depth profile. The XPS depth profile data is in good agreement with the EPMA atomic concentration data, showing a composition near $Zr_{40}Cu_{35}Al_{15}Ni_{10}$. The decrease in Zr(0) seen at the surface of the film is due to native oxidation, which forms a Zr(IV) oxide.

TABLE 1

Elemental composition of ZrCuAlNi AMMFs grown at different sputter conditions as obtained via EPMA. The first number is the atomic concentration while the second number is the atomic percent.

| Deposition Conditions | Zr | Cu | Al | Ni | O |
|---|---|---|---|---|---|
| 3 mtorr, 150 W RF, 20 sccm Ar | 51.2/37.4 | 33.4/35.0 | 5.7/14.0 | 8.9/10.0 | 0.9/3.6 |
| 5 mtorr, 75 W DC, 20 sccm Ar | 51.0/36.9 | 34.0/35.2 | 5.8/14.1 | 8.1/9.1 | 1.2/4.8 |
| 2 mtorr, 175 W RF, 20 sccm Ar | 50.7/36.9 | 33.3/34.8 | 5.6/13.8 | 9.6/10.9 | 0.9/3.5 |

ZrCuAlNi AMMF Atomic Order and Surface Morphology

The amorphous nature of AMMFs is considered an important characteristic allowing for the realization of a homogeneously smooth AMMF surface. To illustrate the level of atomic order present in the studied ZrCuAlNi AMMFs, both x-ray diffraction (XRD) analysis and electron diffraction analysis is presented.

Figure 18:
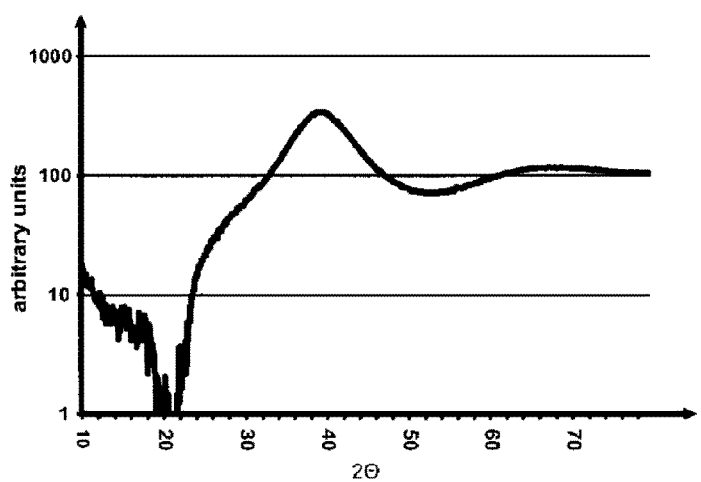
FIG. 18: Representative XRD spectrum obtained from a 200 nm ZrCuAlNi AMMF deposited on to glass.

FIG. 18 presents an XRD spectrum taken from a 200 nm ZrCuAlNi AMMF that was deposited with the standard conditions onto a glass substrate to avoid crystalline XRD signals from the substrate. The spectrum presented has the glass substrate XRD spectrum subtracted to show only the spectrum from the AMMF. The y axis of the presented data is formatted with a logarithmic y axis to illustrate the lack of crystalline peaks in the spectrum. The XRD spectrum indicates the ZrCuAlNi AMMF is amorphous.

FIG. 19(a) presents an electron diffraction pattern from a 200 nm ZrCuAlNi AMMF deposited with the standard conditions. The absence of discrete points in the electron diffraction pattern indicates that the film has no long-range order. The presence of a single, diffuse ring in the electron diffraction pattern suggests that the film is substantially amorphous. An electron diffraction pattern obtained from the Si substrate is shown in FIG. 19(b). The Si electron diffraction pattern presents an electron diffraction pattern of a single crystalline material in order to highlight the differences seen in electron diffraction patterns between single crystalline and amorphous materials.

Figure 5:
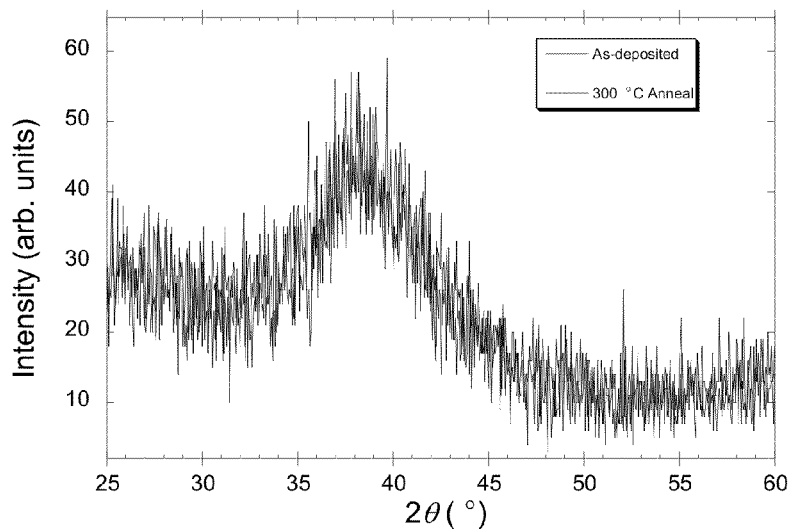
FIG. 5: XRD patterns of two AMMFs ($Zr_{55}Cu_{30}Al_{10}Ni_5$ composition) deposited via RF magnetron sputtering onto a <100> silicon substrate at room temperature. The two patterns are from an as-deposited film, and after a 300° C. anneal in air for 1 hour.
Figure 6:
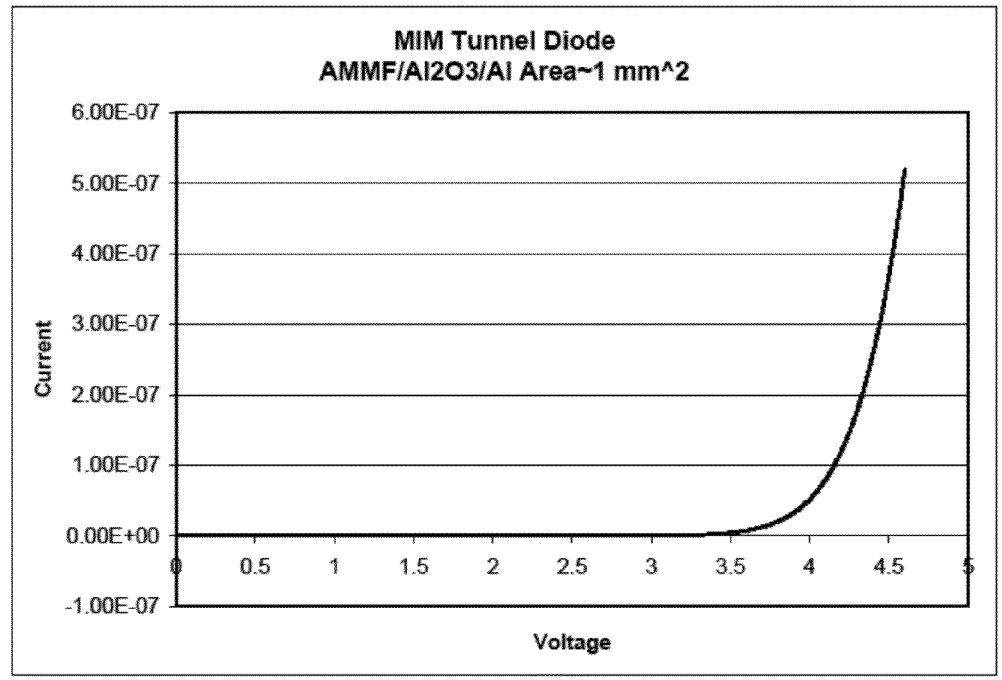
FIG. 6: I vs V Curve (bi-directional) of Tunnel diode created with AMMF ($Zr_{55}Cu_{30}Al_{10}Ni_5$ composition). Lack of hysteresis and low sub-turn on current (22 pA average between 0 and 2.5 V) illustrate interface quality between AMMF and insulator.
Figure 7:
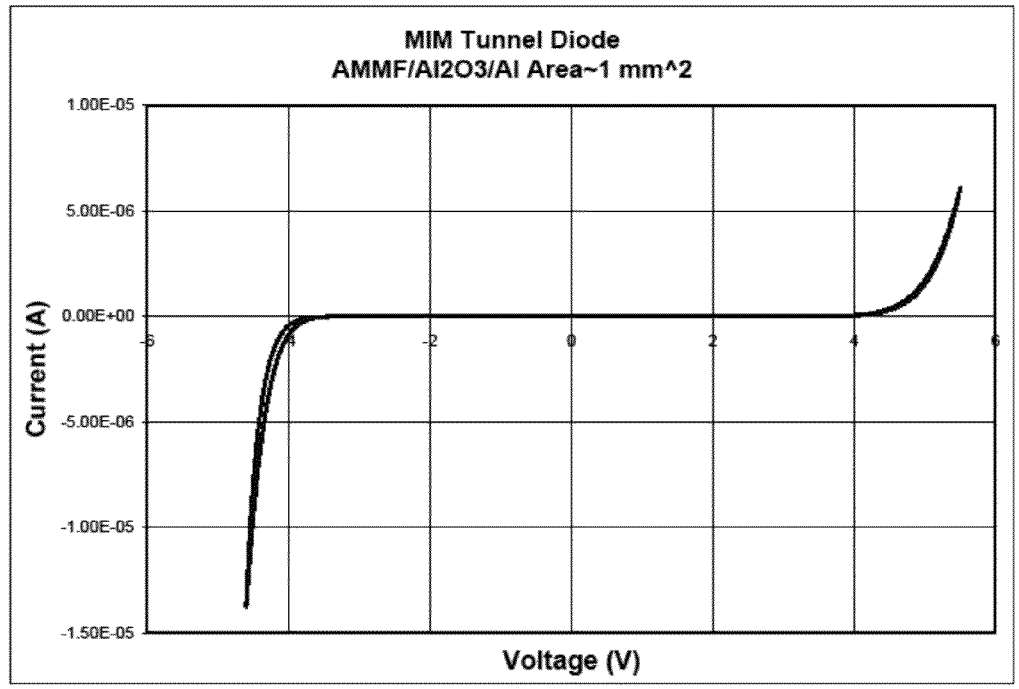
FIG. 7: I vs V Curve (bi-directional) of Tunnel diode created with AMMF ($Zr_{55}Cu_{30}Al_{10}Ni_5$ composition). Hysteresis on negative sweep due to interface between dielectric and Al electrode (non-AMMF). Asymmetric positive and negative sweeps is due to electrode compositional asymmetry.
Figure 8:
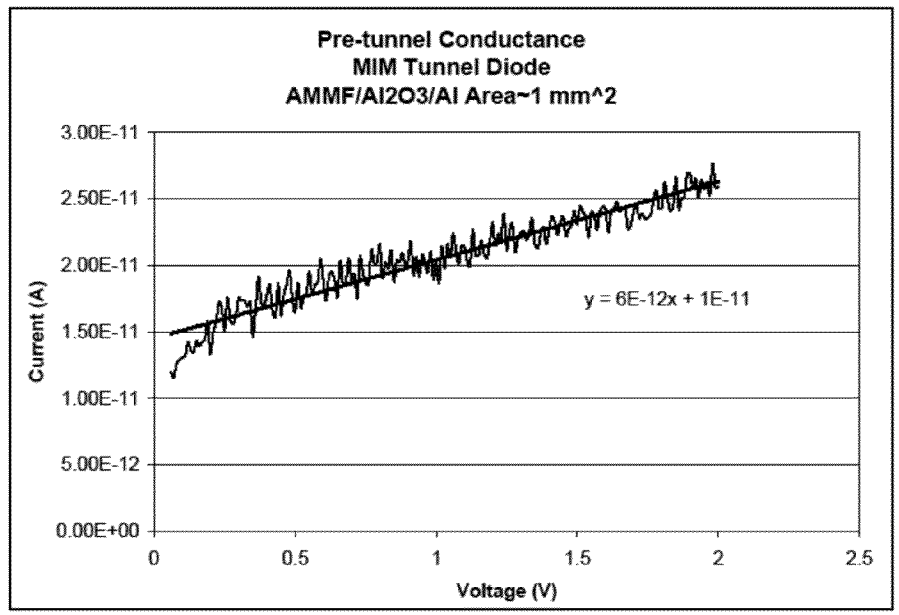
FIG. 8: Low voltage (pre-tunneling) IV curve illustrating low conductance (high resistance). The pA level noise of the curve is hypothesized to occur due to probing noise in the measurement system.

X-ray diffraction (XRD) analysis was carried out to verify the amorphous nature of the AMMFs deposited via RF magnetron sputtering. FIG. 5 shows XRD spectra of films as-deposited and after a 300° C. anneal in air for 1 hour. The broad peak at 20-38° is indicative of the short range order that exists in an amorphous film. Any crystalline film would manifest itself in the XRD analysis as sharp peaks. The resulting 2θ position of these peaks would depend on the specific crystalline phases associated with the combinations of the constituent elements in the film that had crystallized.

TABLE 2

RMS surface roughness of ZrCuAlNi AMMFs grown at different sputter conditions as analyzed via atomic force microscopy (AFM).

| Pressure (mTorr) | Power (W) | Thickness (nm) | RMS roughness (nm) |
|---|---|---|---|
| 3 | 150 (RF) | 253 | 0.11 |
| 3 | 150 (RF) | 252 | 0.13 |
| 5 | 150 (RF) | 188 | 0.17 |
| 3 | 100 (RF) | 122 | 0.21 |
| 3 | 150 (RF) | 505 | 0.22 |
| 5 | 100 (RF) | 38 | 0.20 |
| 5 | 100 (RF) | 30 | 0.18 |
| 3 | 60 (DC) | 38 | 0.20 |

All films were deposited using a 20 sccm flow-rate of Ar.

ZrCuAlNi AMMFs deposited with several sputter conditions were analyzed via atomic force microscopy (AFM) to evaluate the surface morphology of the AMMFs. Table 2 lists the root mean square (RMS) roughness of the films as well as the sputter conditions used for the depositions of the ZrCuAlNi AMMFs. The data indicates that the average RMS roughness of the AMMFs is 0.17 nm, with a RMS roughness sample standard deviation of 0.04 nm.

AFM data was collected on ZrCuAlNi AMMF samples annealed in air to determine the impact of temperature on surface roughness. The data, presented in Table 3, shows that the AMMF surface morphology remains homogeneously smooth (RMS roughness less than 0.2 nm) with anneal temperatures in air below 350° C. As the temperature is increased above 400° C., the AMMF surface changes color. A change in surface color is indicative of the growth of a surface oxide. XPS depth profile data collected on as deposited ZrCuAlNi AMMFs shows that the AMMF surface is covered with a native Zr(IV) oxide. XRD spectra collected from as deposited ZrCuAlNi, however, show no sign of a ZrO2 peak. The lack of peaks indicates either the native surface Zr(IV) oxide is amorphous, or the native Zr(IV) oxide is too thin to be seen in the spectrum. The RMS roughness measured on ZrCuAlNi AMMFs annealed at 550° C. provides insight into the affect of film thickness on surface roughness. The 76 nm ZrCuAlNi AMMF film annealed at 550° C. has an RMS roughness of 13.3 nm, while the 505 nm ZrCuAlNi AMMF film annealed at 550° C. has a surface roughness of 110 nm.

TABLE 3

RMS surface roughness of ZrCuAlNi AMMFs annealed in air at different temperatures as analyzed via atomic force microscopy (AFM).

| Temperature (° C.) | Thickness (nm) | RMS roughness (nm) |
|---|---|---|
| 300 | 253 | 0.11 |
| 300 | 188 | 0.10 |
| 325 | 38 | 0.17 |

TABLE 3-continued

RMS surface roughness of ZrCuAlNi AMMFs annealed in
air at different temperatures as analyzed via atomic force
microscopy (AFM).

| Temperature (° C.) | Thickness (nm) | RMS roughness (nm) |
|---|---|---|
| 325 | 30 | 0.17 |
| 350 | 38 | 0.18 |
| 350 | 30 | 0.18 |
| 400 | 253 | 1.9 |
| 400 | 505 | 1.7 |
| 550 | 505 | 110 |
| 550 | 76 | 13.3 |

XRD spectra of ZrCuAlNi AMMFs annealed at temperatures greater than 350° C. show spectral peaks at 2θ values of approximately 30°, 34°, 50°, and 58°. These four spectral peaks are indicative of the presence of tetragonal $ZrO_2$.

Figure 3:
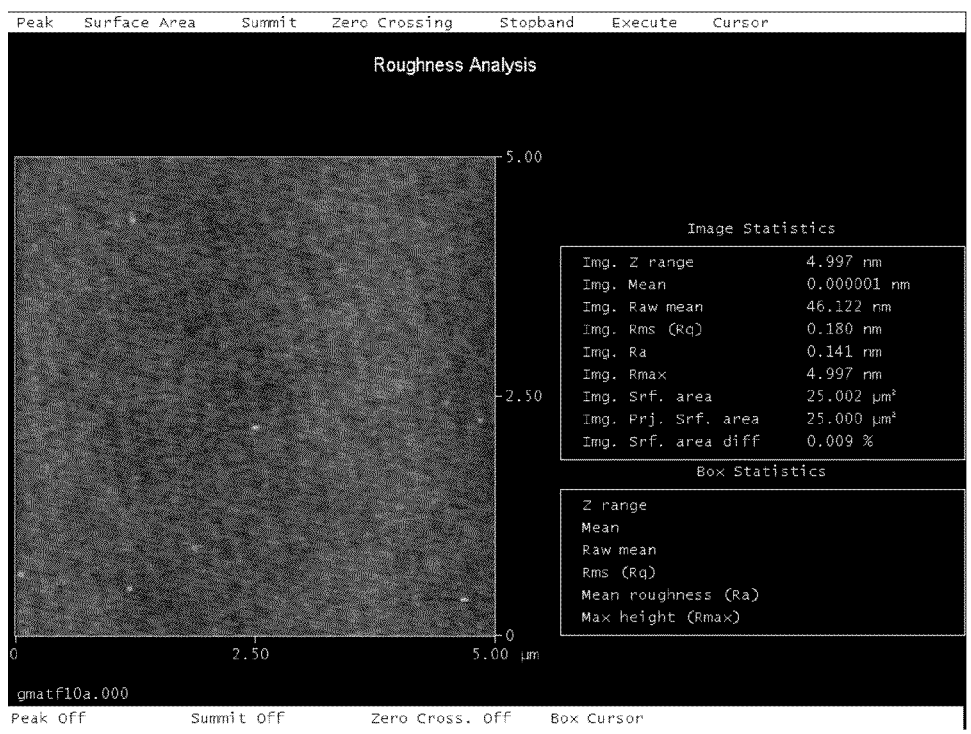
FIG. 3: Atomic force micrograph image of an AMMF ($Zr_{55}Cu_{30}Al_{10}Ni_5$ composition) deposited via RF magnetron sputtering onto a silicon substrate at room temperature.
Figure 4:
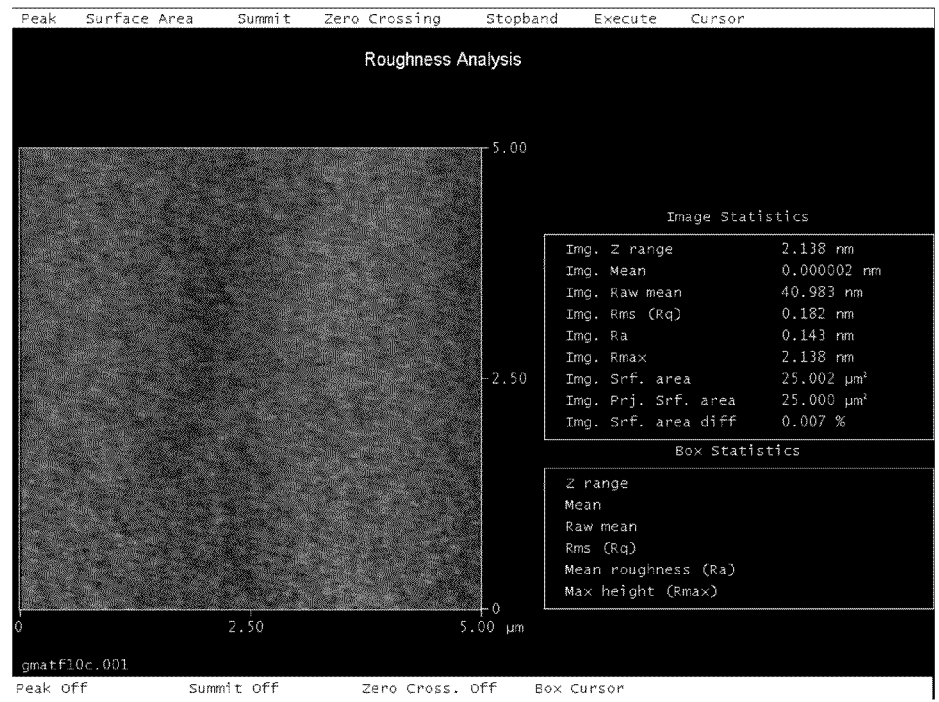
FIG. 4: Atomic force micrograph image of an AMMF ($Zr_{55}Cu_{30}Al_{10}Ni_5$ composition) deposited via RF magnetron sputtering onto a <100> silicon substrate at room temperature and subsequently subjected to a 350° C. anneal in air for 1 hour.

The atomic force microscope (AFM) image in FIG. 3 indicates that an ultra-thin AMMF (less than 50 nm based on profilometer measurements and growth rate characterization) can be deposited via RF sputtering of a multicomponent target onto a Si <100> substrate at room temperature (no substrate heating). Furthermore, it has been discovered that certain AMMFs retain their surface smoothness even after certain types of thermal processing. The AFM image in FIG. 4 shows that the same film (less than 50 nm) annealed in air at 350° C. does not roughen.

ZrCuAlNi AMMF Resistivity Characterization

The resistivity of ZrCuAlNi AMMFs with varying thicknesses, deposited under differing sputter conditions, was measured using a four-point probe. Resistivity measurements across 17 AMMFs with thicknesses between 30 nm and 605 nm have an average resistivity of 208 µΩ-cm, with a sample standard deviation of 15 µΩ-cm. The coefficient of variation (CV) of a measurement is defined as the sample standard deviation divided by the mean of the sample measurements. In general, a CV of less than 10% suggests a repeatable fabrication process and measurement technique. The CV of the measured ZrCuAlNi resistivity is 7.2% of the average resistivity of the measured films, indicating that the resistivity is repeatable across sputter deposition parameters and film thicknesses. Additionally, the low CV value indicates that the four-point probe resistivity measurement used to collect the sample data is repeatable.

ZrCuAlNi AMMF Work Function Characterization

The workfunction of electrode materials in two-terminal and three-terminal tunneling devices has a direct impact on the device current-voltage characteristics.

Table 4 presents mean workfunction and workfunction sample standard deviation data measured via Kelvin probe on four materials to allow for comparisons between the ZrCuAlNi AMMF and other materials. The measured workfunction data indicates that the variation of measured ZrCuAlNi AMMF workfunction is on the same order as materials deposited by solution deposition, RF magnetron sputter deposition, and thermal evaporation. Low workfunction variation across a substrate is important to minimize the variation of electronic device performance when the device performance is dependent on electrode workfunction.

TABLE 4

Workfunction data collected from four different metal films.

| Film Type | Deposition Technique | Mean Workfunction (eV) | Sample Standard Deviation (eV) |
|---|---|---|---|
| Al | thermal evaporation | 3.957 | 0.015 |
| MoW | RF Magnetron Sputtering | 4.777 | 0.009 |
| ZrCuAlNi AMMF | DC Magnetron Sputtering | 4.705 | 0.033 |
| Ag | Solution Deposition | 5.153 | 0.023 |

Homogeneously Smooth, Ultra-Thin ZrCuAlNi AMMFs

The base electrode of a HET must be ultra-thin to ensure a low scattering rate of the electrons that comprise the device current between the emitter and collector electrodes. Additionally, the interfaces between the base electrode of a HET and the dielectrics on either side of the base layer (i.e., the collector and emitter dielectrics) should be homogeneously smooth. A homogeneously smooth interface between an electrode and a tunneling dielectric in a MIM diode may be important for MIM diode operation. In the cases of the base electrode of a HET and the electrode of a MIM diode, a homogeneously smooth interface allows for a uniform electric field between an electrode and adjacent dielectrics. As uniform electric fields are required for repeatable HET and MIM tunnel diode operation, the AMMF can be used for the emitter, base, or collector electrode material of a HET or a MIM diode.

FIG. 20 presents a transmission electron microscope (TEM) micrograph of a ZrCuAlNi AMMF/aluminum phosphate glass (AlPO—light grey) nanolaminate with 20 nm targeted bilayer thicknesses. The 10 nm ZrCuAlNi AMMF layers are seen to be contiguous with homogeneously smooth interfaces through the analysis area. Note that the interface between the base 200 nm ZrCuAlNi AMMF (dark) layer and the first AlPO (dark grey) layer is rough. The contiguous nature of the ultra-thin AMMF layer and homogeneously smooth interfaces between the ZrCuAlNi AMMFs and neighboring dielectrics in FIG. 20 indicate that AMMFs may be used for the base electrode material of HETs as well as the electrode material of MIM diodes and HETs.

Two-Terminal Device Electrical Characterization

The devices described below are patterned devices fabricated with a ZrCuAlNi AMMF, or are patterned devices with at least one electrode made of a ZrCuAlNi AMMF.

MIM Tunnel Diodes with AMMF Electrodes

The operation of a MIM tunnel diode fabricated with an AMMF electrode may benefit from the homogeneously smooth AMMF surface. A homogeneously smooth AMMF surface creates a uniform interface between a tunneling dielectric and an AMMF electrode. The uniform interface allows for a uniform electric field across the tunnel dielectric, which in turn gives rise to repeatable device operation. The following characterization of MIM tunnel diodes shows current characteristics, zero-bias resistance (ZBR), and I-V asymmetry are modulated through the choice of electrode and tunnel dielectric materials. The thickness of the tunnel dielectric impacts ZBR.

FIG. 12 (a) specifies the layers used for the first MIM diode fabricated with an AMMF bottom electrode. The MIM structures reported herein are fabricated on one inch by one inch Si substrates with 100 nm of thermal $SiO_2$. The unpatterned ZrCuAlNi bottom electrodes are deposited via DC magnetron sputtering under standard conditions. The $Al_2O_3$ tunneling dielectric is deposited via ALD. The top Al electrode has and area of ~1 mm² and is thermally evaporated and patterned via shadowmasking. FIG. 12 (b) presents the I-V curve measured on the first MIM diode fabricated with a ZrCuAlNi AMMF bottom electrode. The I-V curve shows a sharp increase of current as voltage is increased, which is the expected diode behavior.

A series of MIM diodes with differing $Al_2O_3$ tunnel dielectric thicknesses and symmetric AMMF electrodes were fabricated to investigate the impact that tunnel dielectric thicknesses has on MIM diode I-V curves. The MIM diodes were fabricated with blanket ZrCuAlNi bottom electrodes and ~1 mm² shadowmasked ZrCuAlNi upper electrodes. FIG. 13 shows an overlay of the I-V curves of MIM diodes with $Al_2O_3$ tunnel dielectrics of 2, 3, 5, and 10 nm. As expected, there is an inverse correlation between current and tunnel dielectric thickness at a given voltage. An inverse correlation between current and tunnel dielectric thickness is consistent with the Fowler-Nordheim equation.

I-V Symmetry Modulation of MIM Diodes

Rectification of an AC signal is one possible application of a MIM diode. To exhibit rectifying behavior without application of a DC voltage offset, a MIM diode must possess asymmetry in its I-V characteristics. FIG. 10 (a) shows evidence of asymmetric interfaces in MIM diodes with two ZrCuAlNi electrodes. The polarity dependence of the current with respect to applied bias in the diodes with dielectric thicknesses greater than or equal to 3 nm provides evidence of asymmetric interfaces. FIG. 10 (b) presents the calculated asymmetry metric as a function of the dielectric thickness of diodes shown in FIG. 10(a). The MIM diodes with thicker tunnel dielectrics are more asymmetric than the MIM diode with a 2 nm dielectric. However, the experimental data of FIG. 10(b) does not reveal a monotonic increase in asymmetry with dielectric thickness. The asymmetry presented in FIG. 10 (a) is observed in MIM diodes with two ZrCuAlNi AMMF electrodes. Therefore, the two potential barriers between MIM diode electrodes and the tunneling dielectric of diodes fabricated with two ZrCuAlNi AMMF electrodes appear to be different. The potential barrier difference is due to the deposition conditions experienced by each interface. The lower interface is formed when $Al_2O_3$ is deposited via ALD onto a blanket ZrCuAlNi AMMF. An ALD $Al_2O_3$ deposition imparts little interfacial damage to the lower ZrCuAlNi electrode. There is, however, a native Zr(IV) oxide on the ZrCuAlNi AMMF electrode surface. The upper interface is formed when a shadowmasked ZrCuAlNi AMMF electrode is deposited via DC magnetron sputtering onto an $Al_2O_3$ tunnel dielectric.

The potential barrier difference is due to the deposition conditions experienced by each interface. The lower interface is formed when $Al_2O_3$ is deposited via ALD onto a blanket ZrCuAlNi AMMF. An ALD $Al_2O_3$ deposition imparts little interfacial damage to the lower ZrCuAlNi electrode. There is, however, a native Zr(IV) oxide on the ZrCuAlNi AMMF electrode surface. The upper interface is formed when a shadowmasked ZrCuAlNi AMMF electrode is deposited via DC magnetron sputtering onto an $Al_2O_3$ tunnel dielectric. The top, shadowmasked electrode is deposited under vacuum, so there is hypothesized to be less Zr(IV) native oxide between the ZrCuAlNi electrode interface and the $Al_2O_3$ tunnel dielectric. DC magnetron sputtering deposition imparts energy into the $Al_2O_3$ tunnel dielectric and, therefore, causes some level of deposition-induced damage which is likely to give rise to the observed potential barrier difference. The process-induced asymmetry is not precisely controlled, which creates the deviation in asymmetry trends associated with dielectric thicknesses.

MIM Diode Zero-Bias Resistance

The zero-bias resistance (ZBR) of a MIM diode is defined as the ohmic resistance seen at very low voltages. Dielectric thickness has the largest effect on ZBR. Without a sufficiently thin dielectric (less than 3 nm of $Al_2O_3$), the ZBR is greater than $1 \times 10^9 \Omega$ for symmetric MIM diodes. As expected, the ZBR decreases as the thickness of the tunnel dielectric decreases. ZBR begins to drop precipitously when the insulator thickness is reduced to less than about 3 nm. MIM diodes with a 60 nm zinc-tin-oxide (ZTO) tunneling barrier were fabricated to investigate the impact of tunnel barrier height on ZBR. A thickness of 60 nm is large enough to negate the impact that image force lowering caused by the dielectric constant of the tunnel barrier insulator. Symmetric MIM diodes with ZrCuAlNi AMMF electrodes and asymmetric MIM diodes with a blanket bottom ZrCuAlNi electrode and a 1 mm² shadow masked Al upper electrode both showed I-V curves with non-linear, diode behavior. The ZBR of a ZTO MIM diode is measured to be $1:3 \times 10^4 \Omega$, which is a significantly lower ZBR than MIM diodes fabricated with $Al_2O_3$ dielectrics.

Three-Terminal Device Electrical Characterization

Figure 9:
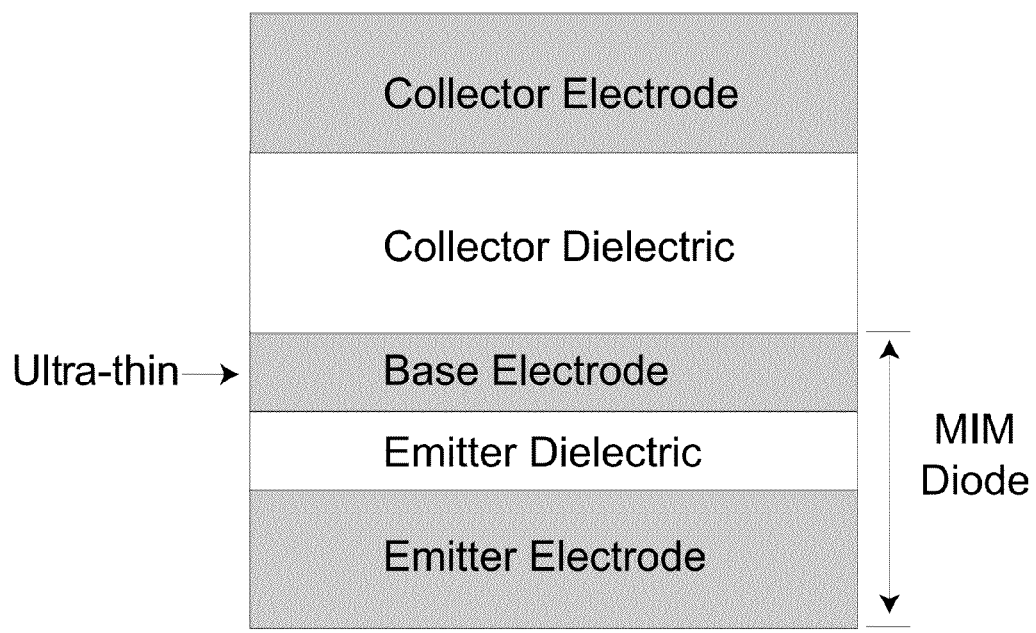
FIG. 9: Illustration of the physical layers of a MIMIM HET.
Figure 15:
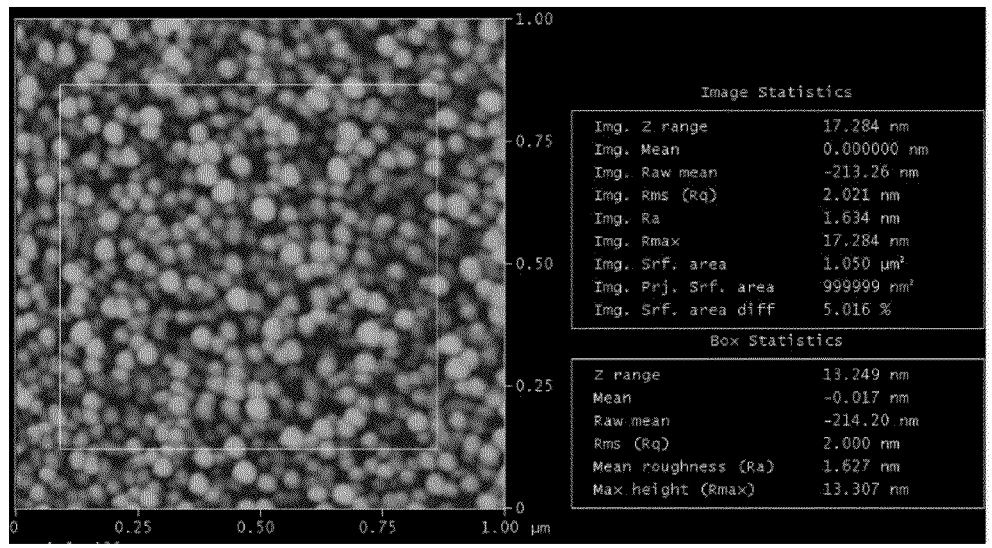
FIG. 15: 200 nm $TiAl_3$ AMMF RMS roughness is 2 nm.
Figure 16:
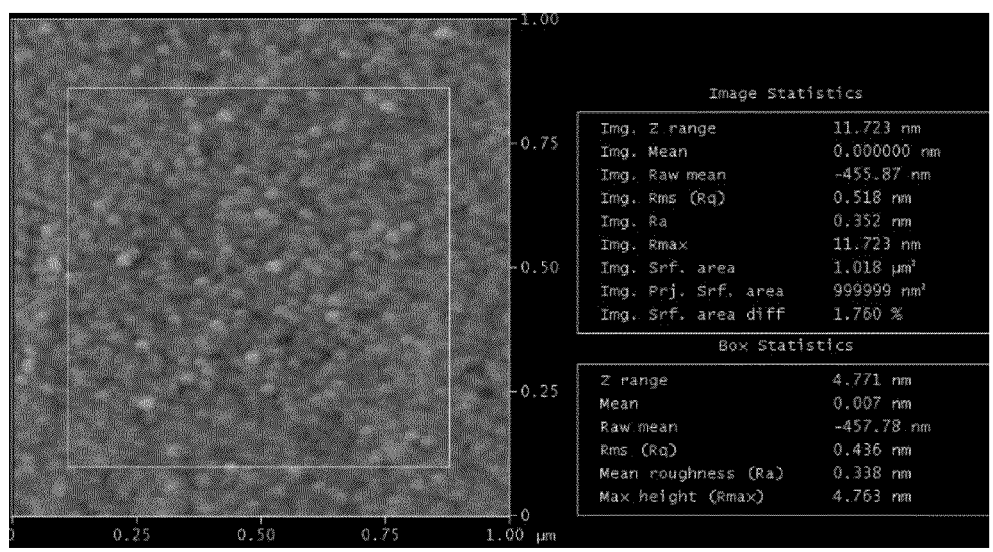
FIG. 16: 200 nm ZrCuAlNi AMMF RMS roughness run at the same time as FIG. 15 is 0.5 nm. Seeing as $TiAl_3$ AMMF MIM diodes work well, RMS roughness is not a predictor of alone of MIM diode performance.

A MIMIM HET employs a MIM diode as a hot-electron injector (see FIG. 9). The homogeneously smooth surface of an AMMF is shown to produce reliable MIM diode operation when the electrodes are fabricated with ZrCuAlNi AMMFs. The base electrode of a MIMIM HET must be ultra-thin in order to reduce the probability of hot-electron scattering in the base layer. The TEM micrograph presented in FIG. 20 shows contiguous, ultra-thin AMMF layers having smooth interfaces on either side of the AMMFs. Reliable MIM diode operation and ultra-thin, contiguous films make AMMFs attractive electrode materials for the emitter and base electrodes in a MIMIM HET.

A four-layer mask was employed to fabricate HETs with ZrCuAlNi AMMF electrodes and $Al_2O_3$ dielectrics (see FIG. 11). The thickness of the emitter and collector $Al_2O_3$ dielectrics were modulated to investigate the impact of dielectric thickness on HET operation. All of the processing runs employ 200 nm ZrCuAlNi AMMF emitter and collector thicknesses and a 10 nm ZrCuAlNi AMMF base electrode thickness.

Figure 23:
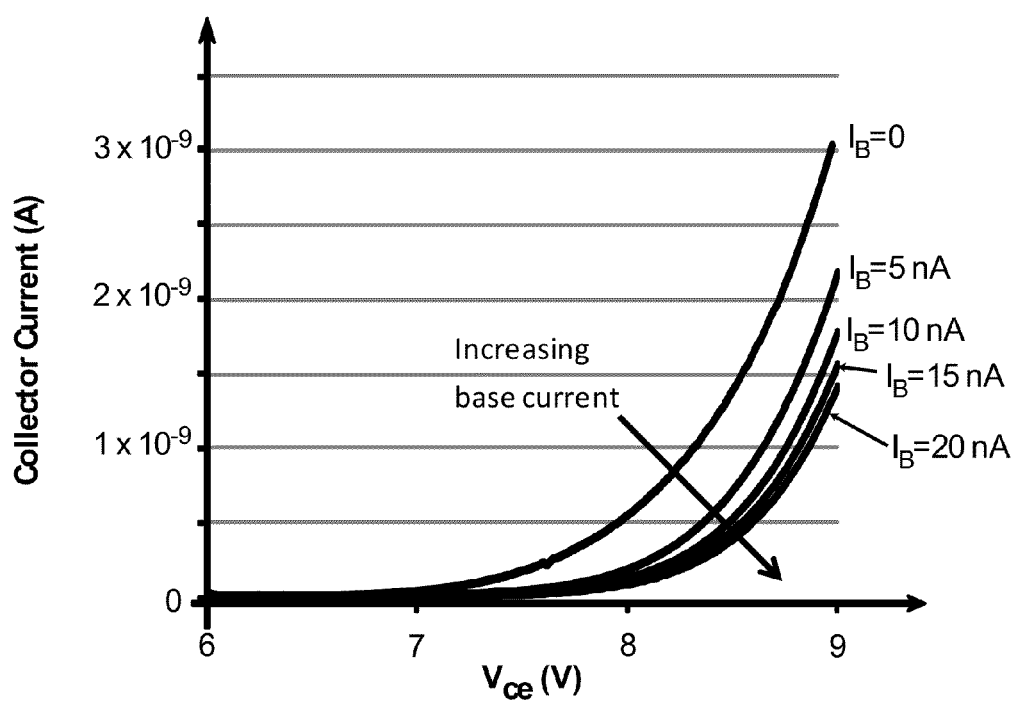
FIG. 23: I-V curves from a HET fabricated with ZrCuAlNi electrodes and $Al_2O_3$ dielectrics.

The process used to test HETs fabricated with AMMF electrodes beings with a resistance measurement between the electrodes to check for shorting. The percentage of HETs not exhibiting collector/emitter shorting was approximately five percent. In cases where collector/emitter shorting is not detected, HETs are tested using a common-emitter configuration. FIG. 23 presents a series of common emitter I-V curves with increasing applied base current, collected for a HET fabricated with ZrCuAlNi AMMF electrodes and $Al_2O_3$ dielectrics. The HET was fabricated with 200 nm thick ZrCuAlNi AMMF emitter and collector electrodes, a 10 nm thick ZrCuAlNi AMMF base electrode, a 5 nm $Al_2O_3$ emitter dielectric, and a 40 nm $Al_2O_3$ collector dielectric.

$TiAl_3$ AMMFs

Figure 21:
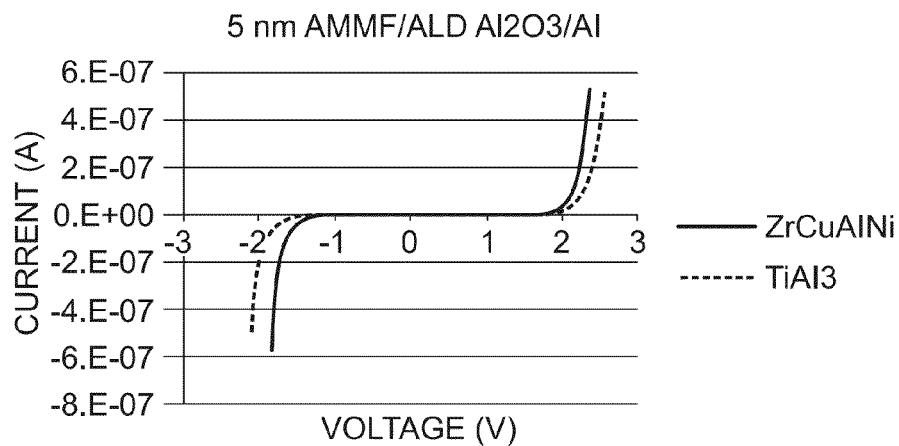
FIG. 21: Current-Voltage curves from MIM diodes fabricated with either ZrCuAlNi AMMF or $TiAl_3$ AMMF blanket lower electrodes and evaporated Al upper electrodes. Asymmetry of ZrCuAlNi MIM is 74.2 at 1.8 V, asymmetry of $TiAl_3$ MIM is 14.3 at 1.8 V. This illustrates a lowering of asymmetry by the use of an AMMF with a lower workfunction (closer to Al work function). The net current of the $TiAl_3$ MIM diode is lower, which is hypothesized to occur due to the ALD $Al_2O_3$ nucleating faster on the native oxide of the $TiAl_3$ giving rise to a net thicker dielectric.
Figure 22:
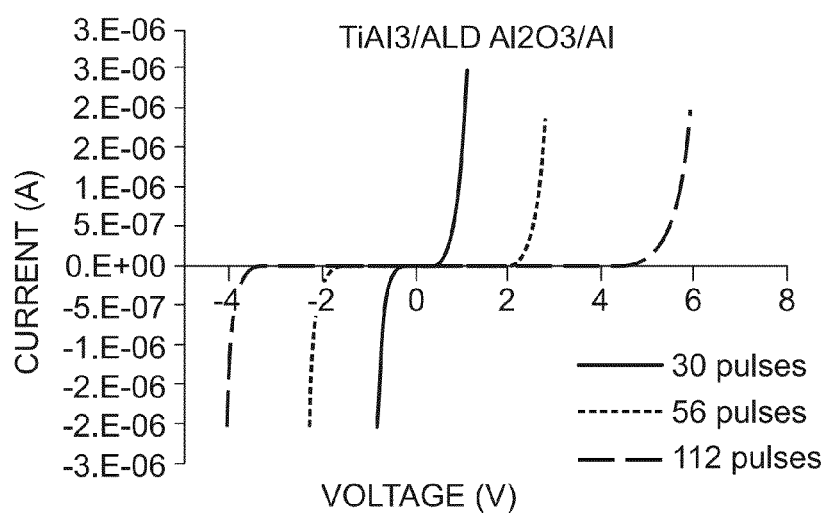
FIG. 22: Current-voltage curves from bottom blanket $TiAl_3$ diodes with evaporated Al upper electrodes and $Al_2O_3$ dielectrics.

MIM diodes were fabricated with $TiAl_3$ AMMF blanket lower electrodes with evaporated Al upper electrodes and $Al_2O_3$ dielectrics. The MIM diode's electronic characteristics are shown in FIGS. 21 and 22. A $TiAl_3$ AMMF electrode can provide MIM diode and HET fabrication processes that are able to utilize photolithographic patterning. Photolithographic patterning of AMMF electrodes can lead to smaller dimensions and better alignment which, in turn, will lead to more reliable, faster device operations.

Figure 17:
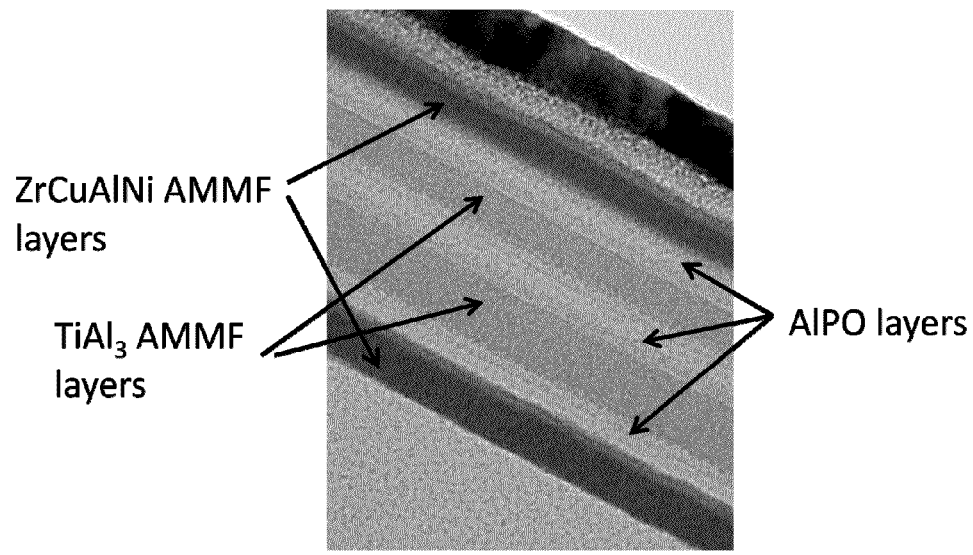
FIG. 17: TEM of nanolaminate made with ZrCuAlNi AMMF, $TiAl_3$ AMMF and AlPO layers. Image illustrates a lack of crystalline features in films. TEM prep layers are on top of top ZrCuAlNi AMMF (C and Ir), $SiO_2$ is underneath lower ZrCuAlNi AMMF.

In addition $TiAl_3$ AMMFs and nanolaminates were fabricated and characterized as shown in FIGS. 14 and 17.

In general, the TiAl$_3$ AMMFs were made with DC magnetron sputtering using 20 to 200 W, Ar carrier gas and 1 to 20 mTorr.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. An amorphous multi-component metallic film electronic device, comprising:
   (a) a first electrode comprising a first metal layer;
   (b) a second electrode comprising a second metal layer; and
   (c) an intermediate layer located between the first metal layer and the second metal layer comprising at least one of an insulator and a semiconductor,
   wherein at least one of the metal layers comprises an amorphous multi-component metallic film, and wherein the electrodes and intermediate layer are structured to form a diode.

2. The amorphous multi-component metallic device according to claim 1, wherein the first electrode comprises an emitter electrode, the second electrode comprises a base electrode, and the intermediate layer comprises an emitter layer, and wherein the device comprises a collector electrode and collector layer disposed between the collector electrode and base electrode, the collector layer comprising at least one of an insulator and a semiconductor, and wherein the base electrode, collector electrode, emitter electrode, collector layer, and emitter layer cooperate to provide a vertical transport thin-film transistor.

3. The amorphous multi-component metallic film electronic device of claim 1 or claim 2, wherein the amorphous multi-component metallic film has a resistivity of at least 100 μΩ-cm.

4. The amorphous multi-component metallic film electronic device of claim 1 or claim 2, wherein the amorphous multi-component metallic film comprises at least one element selected from Groups IV, V, VI, X, XI, XIII, XIV, Mg, and Zn.

5. The amorphous multi-component metallic film electronic device of claim 1 or claim 2, wherein the first metal layer has a thickness of 10 to 500 nm, the intermediate layer has a thickness of 1 to 50 nm, and the second metal layer has a thickness of at least 1 nm.

6. The amorphous multi-component metallic film electronic device of claim 1 or claim 2, wherein the amorphous multi-component metallic film comprises at least about 2-4 element components comprising a Group IV element, a Group V element, a Group VI element, a Group X element, a Group XI element, a Group XIII element, a Group XIV element, Mg, Zn, or a combinations thereof.

7. The amorphous multi-component metallic film electronic device of claim 6, wherein the amorphous multi-component metallic film comprises Ti, Al, or a combination thereof.

8. The amorphous multi-component metallic film electronic device of claim 6, wherein the amorphous multi-component metallic film comprises Al, Zr, Cu, Ni, or a combination thereof.

9. The amorphous multi-component metallic film electronic device of claim 1 or claim 2, wherein the first and second metal layers each comprise an amorphous multi-component metallic film.

10. The amorphous multi-component metallic film electronic device of claim 9, wherein the first metal layer comprises at least one elemental component that differs from the elemental components of the second metal layer.

11. The amorphous multi-component metallic film electronic device of claim 1 or claim 2, wherein at least one of the electrodes comprises Ru, Ir, Pt, Al, Au, Ag, Nb, Mo, W, Ti, Cu, or a combination thereof.

12. The amorphous multi-component metallic film electronic device of claim 1 or claim 2, wherein at least one of the electrodes comprises a metal nitride.

13. The amorphous multi-component metallic film electronic device of claim 12, wherein the metal nitride comprises TiN, TaN, WN, NbN, or a combination thereof.

14. The amorphous multi-component metallic film electronic device of claim 1 or claim 2, wherein the intermediate layer comprises Al$_2$O$_3$, aluminum phosphate, silicon dioxide, a metal halide, zirconium oxide, hafnium dioxide, titanium dioxide, SnO$_2$, ZnO or a combination thereof.

15. The amorphous multi-component metallic film electronic device of claim 1 or claim 2, wherein the amorphous multi-component metallic film has a resistivity of at least about 100 μΩ-cm.

16. The amorphous multi-component metallic film electronic device of claim 1 or claim 2, wherein the amorphous multi-component metallic film has a surface having a root mean square (RMS) roughness of less than about 3 nm.

17. The amorphous multi-component metallic film electronic device of claim 16, wherein the RMS roughness is less than about 0.5 nm.

18. The amorphous multi-component metallic film electronic device of claim 1 or claim 2, wherein the amorphous multi-component metallic film has a thickness of less than about 200 nm.

19. A method for making an amorphous multi-component metallic film electronic device, comprising:
   forming a first electrode comprising a first metal layer;
   forming an intermediate layer comprising at least one of an insulator and a semiconductor over the first metal layer; and
   forming a second electrode comprising a second metal layer over the intermediate layer, wherein at least one of the metal layers comprises an amorphous multi-component metallic film, and wherein the electrodes and intermediate layer are structured with the intermediate layer disposed between the electrodes to provide a diode.

20. The method according to claim 19, comprising forming collector layer comprising at least one of an insulator and a semiconductor over the second electrode and forming a collector electrode over the collector layer, wherein the first electrode, second electrode, collector electrode, collector layer, and intermediate layer are structured to form a vertical transport thin-film transistor.

21. The method according to claim 19 or claim 20, wherein the amorphous multi-component metallic film is formed via sputtering, and the intermediate layer is formed via one or more of sputtering, atomic layer deposition, plasma enhanced chemical vapor deposition, and solution processing.

22. The method according to claim 21, wherein the sputtering is DC magnetron sputtering.

23. The method according to claim 19 or claim 20, wherein the electrodes are disposed in direct contact with the intermediate layer.

24. The method according to claim 19 or claim 20, wherein the first electrode comprises an amorphous multi-component metallic film formed via sputtering, and the intermediate layer and the second electrode are each individually formed via sputtering, atomic layer deposition, plasma enhanced chemical vapor deposition, or solution processing.

25. The method according to claim 19 or claim 20, wherein the amorphous multi-component metallic film comprises at least one element selected from Groups IV, V, VI, X, XI, XIII, XIV, Mg, and Zn.

* * * * *